United States Patent
Warm et al.

(10) Patent No.: US 7,858,957 B2
(45) Date of Patent: Dec. 28, 2010

(54) ILLUMINATION OPTICS FOR PROJECTION MICROLITHOGRAPHY

(75) Inventors: Berndt Warm, Schwaig (DE); Guenther Dengel, Heidenheim (DE)

(73) Assignee: Carl Zeiss SMT AG, Oberkochen (DE)

( * ) Notice: Subject to any disclaimer, the term of this patent is extended or adjusted under 35 U.S.C. 154(b) by 449 days.

(21) Appl. No.: 11/945,401

(22) Filed: Nov. 27, 2007

(65) Prior Publication Data

US 2008/0123807 A1 May 29, 2008

(30) Foreign Application Priority Data

Nov. 28, 2006 (DE) .................. 10 2006 056 035

(51) Int. Cl.
*G02B 26/12* (2006.01)
*G21K 5/04* (2006.01)
*G21K 1/06* (2006.01)

(52) U.S. Cl. .................. 250/504 R; 250/492.1; 250/493.1; 359/350; 359/355; 356/51

(58) Field of Classification Search ............. 250/492.1, 250/492.2, 493.1, 494.1, 504 R; 355/18, 355/44, 45, 46; 378/1, 34, 84, 85, 86, 145, 378/147, 148, 149, 150, 155; 359/350, 355, 359/357, 359, 642, 733, 838, 850, 362, 644, 359/734, 851, 855; 356/51
See application file for complete search history.

(56) References Cited

U.S. PATENT DOCUMENTS

| | | | |
|---|---|---|---|
| 5,066,131 A * | 11/1991 | Iwata et al. | 356/401 |
| 6,507,440 B1 | 1/2003 | Schultz | |
| 6,611,574 B2 | 8/2003 | Singer et al. | |
| 6,658,084 B2 | 12/2003 | Singer | |
| 7,090,362 B2 * | 8/2006 | Holderer et al. | 359/851 |
| 2002/0136351 A1 * | 9/2002 | Singer | 378/34 |
| 2003/0076574 A1 * | 4/2003 | Chen et al. | 359/291 |
| 2005/0002090 A1 * | 1/2005 | Singer et al. | 359/366 |
| 2005/0045830 A1 * | 3/2005 | Shishido et al. | 250/372 |
| 2005/0253081 A1 * | 11/2005 | Shishido et al. | 250/372 |
| 2007/0019310 A1 * | 1/2007 | Seifert et al. | 359/845 |
| 2007/0115449 A1 * | 5/2007 | Dierichs et al. | 355/68 |
| 2007/0223112 A1 * | 9/2007 | Mann et al. | 359/726 |
| 2008/0043321 A1 * | 2/2008 | Bowering et al. | 359/359 |
| 2008/0049206 A1 * | 2/2008 | Ossmann | 355/68 |

FOREIGN PATENT DOCUMENTS

EP 1 024 408 A2 8/2000

* cited by examiner

*Primary Examiner*—Jack I Berman
*Assistant Examiner*—Nicole Ippolito Rausch
(74) *Attorney, Agent, or Firm*—Fish & Richardson P.C.

(57) ABSTRACT

Illumination optics that can be used, for example, for EUV projection microlithography are disclosed. Also disclosed are illumination systems provided with such illumination optics, projection exposure apparatuses provided with such illumination systems, related methods of manufacturing microstructured elements, and microstructured elements obtained by these methods.

25 Claims, 10 Drawing Sheets

ILLUMINATION OPTICS FOR PROJECTION MICROLITHOGRAPHY

CROSS-REFERENCE TO RELATED APPLICATION

This application claims priority under 35 U.S.C. §119 to German patent application serial number 10 2006 056 035.3, filed Nov. 28, 2006, which is hereby incorporated by reference.

FIELD

The disclosure relates to illumination optics that can be used, for example, for EUV projection microlithography. The disclosure also relates to illumination systems provided with such illumination optics, projection exposure apparatuses provided with such illumination systems, related methods of manufacturing microstructured elements, and microstructured elements obtained by these methods.

BACKGROUND

Projection exposure apparatuses are known and are disclosed, for example, in U.S. Pat. No. 6,658,084.

SUMMARY

In one aspect, the disclosure features illumination optics configured to illuminate an illumination field in a reticle plane with radiation. The illumination optics include a facet mirror and a changing device. The facet mirror includes a plurality of facets configured to generate a defined illumination setting in the illumination field. Each facet is configured to be allocated to a partial beam of the radiation, and the facet mirror has subunits which themselves are comprised of facet groups having at least one facet each. The changing device is configured to interchange at least one of the sub-units of the facet mirror with at least one interchangeable subunit. The illumination optics are configured to be used in EUV microlithography.

In another aspect, the disclosure provides an illumination system that includes illumination optics as described in the preceding paragraph and an EUV light source.

In a further aspect, the disclosure provides a projection exposure apparatus that includes an illumination system as described in the preceding paragraph and projection optics configured to image the illumination field in an image field of an image plane.

In an additional aspect, the disclosure features a method that includes using a projection exposure apparatus as described in the preceding paragraph to make a microstructured element.

In some embodiments, the disclosure provides illumination optics which offer the possibility of changing between several illumination settings with less technical effort.

In certain embodiments, the disclosure provides illumination optics having a facet mirror divided into subunits which themselves are composed of facet groups having at least one facet each. A changing device is provided for interchanging at least one of the subunits of the facet mirror with at least one interchangeable subunit.

To provide several illumination settings, it is possible to interchange individual subunits of the facet mirror with other subunits leading to different illumination conditions. In practice, the illumination conditions can be altered by changing the illumination of the illumination field, i.e. the distribution of the illumination angles (illumination setting) by which field points are illuminated. Illumination of the illumination field, i.e. its illuminated surface area, often remains unchanged in practice. Interchanging subunits of the facet mirror on a block-by-block basis can provide a mechanical solution for changing the illumination settings which requires much less technical effort than tilting individual facets. Cooling of the facet mirror, which often is often desirable, can also be ensured while maintaining interchangeability of the subunits. The illumination settings can be changed via just a few actuators of the changing device. Groups of facets, such as groups of facets possessing a larger number of individual facets, can remain mechanically connected, thus helping to ensure an efficient cooling of the facets. Depending on the desirable properties in terms of, for example, throughput or structural resolution of a projection exposure apparatus, the illumination optics can provide the right illumination setting for each of these properties.

In some embodiments, the disclosure provides an illumination optics where at least one facet mirror is configured as a field facet mirror having a plurality of field facets to generate secondary light sources. A pupil facet mirror is provided in the vicinity of at least some of the secondary light sources generated by the field facet mirror. The pupil facet mirror has a plurality of pupil facets which are impinged by EUV radiation via their corresponding field facets. The pupil facet mirror is a part of an optical equipment required to image the field facet mirror in the reticle plane. Illumination of the pupil facet mirror can be altered by interchanging individual subunits of the field facet mirror with other subunits, thus resulting in a different illumination setting. The facet mirror, which is provided with interchangeable subunits, is configured as the field facet mirror. It is not necessary for the pupil facet mirror to be disposed at the exact same location of the secondary light source which is generated. Optionally, the pupil facets of the pupil facet mirror are arranged at a specific distance to the location of the secondary light source, as described in, for example, U.S. Pat. No. 6,611,574.

The illumination optics can optionally be designed in a way as to generate the secondary light sources sagittally and tangentially in planes which are located at a distance to one another. Such an arrangement is known, for example, from U.S. Pat. No. 6,507,440.

In some embodiments, the illumination optics is provided with a single facet mirror having interchangeable subunits. At the same time, the single facet mirror provides for a defined illumination of the illumination field. A corresponding facet mirror is described in, for example, EP 1 024 408 A2.

In certain embodiments, the disclosure provides a field facet arrangement, where the field facets of the field facet mirror are oriented in a way as to enable a subunit of the field facet mirror to illuminate pupil facets which are arranged in a relatively small area of the pupil facet mirror when compared with the entire aperture of the pupil facet mirror. It is possible to change between principal settings, e.g. changing between a conventional and an annular setting, by interchanging subunits of the field facet mirror. Changing between principal settings may not be possible if pupil facets, which are distributed over the entire aperture of the pupil facet mirror, were illuminated by each subunit of the field facet mirror.

In some embodiments, the disclosure provides a changing device with an interchanging drive for interchanging displacement of a subunit carrier in a way as to change between two subunits of the field facet mirror and being provided with a positioning drive for positioning displacement of a base body of one of the subunits of the changing device between a mirror position, where the subunit is situated in a fixed position in the field facet mirror, and a neutral position for interchanging displacement of the subunit carrier, can be realized via a simple drive technology.

In certain embodiments, the disclosure provides a swivel drive that enables the subunit carrier to be rotated about a swivel axis and being part of the interchanging drive provides for the implementation of several interchangeable subunits, with the changing device requiring a tiny amount of space.

In some embodiments, the disclosure provides an arrangement of the swivel axis, wherein the swivel axis coincides with a central axis of the field facet mirror, allows for a compact arrangement of the changing device in the vicinity of, and particularly downstream of the field facet mirror.

In certain embodiments, the disclosure provides a cooling arrangement of the changing device that has a delivery line system for a cooling medium for cooling the interchangeable subunits, in which a line section extends along the swivel axis avoids problems with the cooling line arrangement when the changing device is displaced. The cooling system can be designed in a closed-loop manner.

Optionally, at least one line section of the delivery line system may be configured as a flexible line section. In that case, the base body of the interchangeable subunits is displaceable between the mirror position and the neutral position with minimal technical effort.

In some embodiments, the disclosure provides a positioning drive with a lever arm a free end of which is attached to a base body and is rotatable about a swivel joint via a motor, thus providing for a change of its position. This can, for example, be realized in a structurally simple manner.

In certain embodiments, the disclosure provides changing device arrangements including at least one stop for defining the mirror position and/or comprising at least one snap-in locking unit for fixing the mirror position, which can enable the subunit to be positioned in the mirror position in an exact position and an exact angle.

In some embodiments, at least one of one area of the pupil facet mirror and the illumination field may be illuminated by stationary, i.e. non-interchangeable, subunits of the facet mirror. Such subunits can illuminate areas of the pupil facet mirror which must be illuminated at any given illumination setting, and/or illuminate the illumination field in always the same way. This can result in a simpler structural design of the illumination optics.

In certain embodiments, the disclosure provides local area illumination by the interchangeable subunits, wherein an interchangeable subunit illuminates a central area of the pupil facet mirror or a first annular area surrounding a central area of the pupil facet mirror or an external annular area of the pupil facet mirror or an adjacent annular area of the pupil facet mirror. The adjacent annular area adjoins an external annular area or two opposite external boundary areas of the pupil facet mirror. The boundary areas have the shape of a pitch circle or a segment or two opposite adjacent boundary areas of the pupil facet mirror. The adjacent boundary areas have the shape of a pitch circle or a segment. Adjoining the external boundary areas of the pupil facet mirror or opposite areas adjoining the central area, have proved particularly suitable when different illumination settings are to be provided. Corresponding local area illumination settings can also be implemented in embodiments of the illumination optics in which secondary light sources are generated sagittally and tangentially in planes that are located at a distance to one another, or which are provided with a single facet mirror comprising interchangeable subunits. In the latter case, corresponding areas of the illumination field are illuminated to different extents when the subunits are interchanged.

In some embodiments, the disclosure provides illumination systems with the illumination optics, projection exposure apparatuses with the illumination systems, methods of manufacturing microstructured elements using the projection exposure apparatuses, and microstructured elements obtained by the methods.

In certain embodiments, the disclosure provides an illumination system having illumination optics and an EUV light source. In some embodiments, the disclosure provides a projection exposure apparatus having such an illumination system and projection optics configured to image the illumination field in an image field of an image plane. In certain embodiments, the disclosure provides a method of manufacturing a microstructured element via a process that includes: providing a projection exposure apparatus as aforesaid, providing a substrate to at least part of which a layer of a light-sensitive material is applied, providing a mask or a reticle provided with structures to be imaged, projecting of at least a part of the reticle to an area of the light-sensitive layer via the projection exposure apparatus or via: implementing the facet mirror of the illumination optics of the projection exposure apparatus in a first configuration of subunits during a first projection step, interchanging one of the subunits of the facet mirror by an interchangeable subunit so as to create a second configuration of subunits of the facet mirror, projecting at least a part of the reticle to an area of the light-sensitive layer via the projection exposure apparatus or by the aforesaid method where at least two subunits of the facet mirror are interchanged with interchangeable subunits for creating the second configuration. In some embodiments, the disclosure provides a microstructured element.

In the following, exemplified embodiments will be described in detail in conjunction with the drawings.

DETAILED DESCRIPTION

Figure 1:
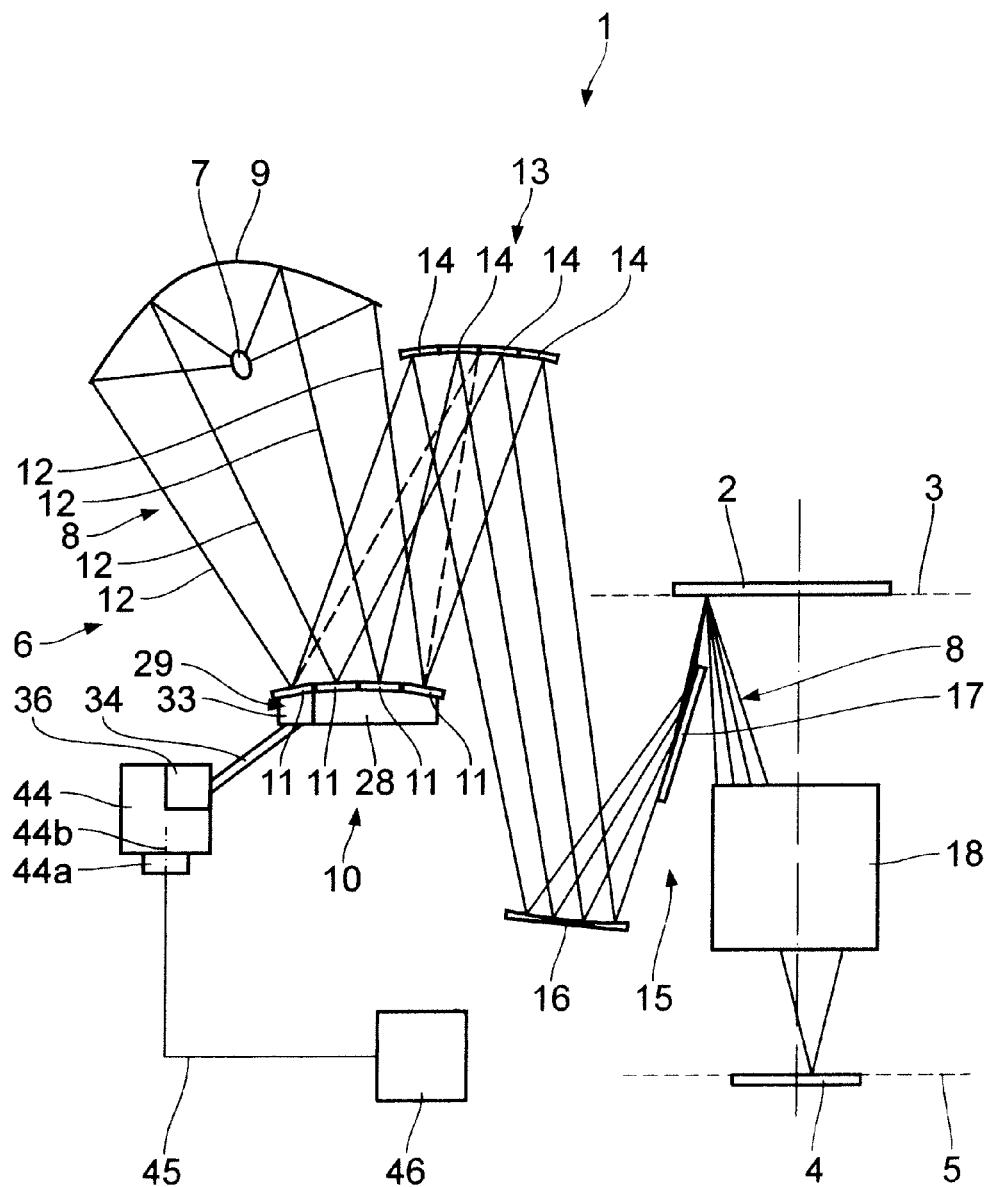
FIG. 1 is a schematic sectional, in particular meridional, view of a projection exposure apparatus for EUV projection microlithography.

FIG. 1 is a schematic representation of a projection exposure apparatus 1 for EUV projection microlithography. The projection exposure apparatus 1 serves to image a structure, which is situated in a reticle plane on a reticle 2, onto a light-sensitive layer of a wafer 4 in a wafer plane 5.

An illumination optics, the entirety of which is designated by the reference number 6, serves to illuminate an illumination field in the reticle plane 3. Together with an EUV light source 7, the illumination optics 6 is configured as an illumination system of the projection exposure apparatus 1.

EUV radiation 8 emitted by the EUV light source 7 is initially collected by a collector 9 which is schematically represented in FIG. 1. Subsequently, the collimated EUV beam hits a field facet mirror 10 provided with a plurality of schematically indicated field facets 11. The field facets 11 serve to generate secondary light sources. The field facets 11 are allocated to particular partial beams 12 of the EUV radiation 8.

A pupil facet mirror 13 is disposed at the location of the secondary light sources generated by the field facet mirror 10. The pupil facet mirror 13 is provided with a plurality of pupil facets 14 which are schematically indicated in FIG. 1 and are impinged by the EUV partial beams 12 via their respective field facets 11.

The pupil facet mirror 13 is part of an optical equipment 15 that serves to image the field facet mirror in the reticle plane 3. The optical equipment 15 is further provided with two imaging mirrors 16, 17.

The structure of the illumination system is schematically represented in FIG. 1 and serves to demonstrate the functions of the field facet mirror 10 and the pupil facet mirror 13. The collector 9 as well as the optical equipment 15 can also be configured in a different arrangement and composed of differently-shaped components as well as different numbers of components.

EUV radiation 8 reflected by the reticle 2 is imaged in an image field in the wafer plane 5 via a schematically indicated projection optics 18.

Figure 2:
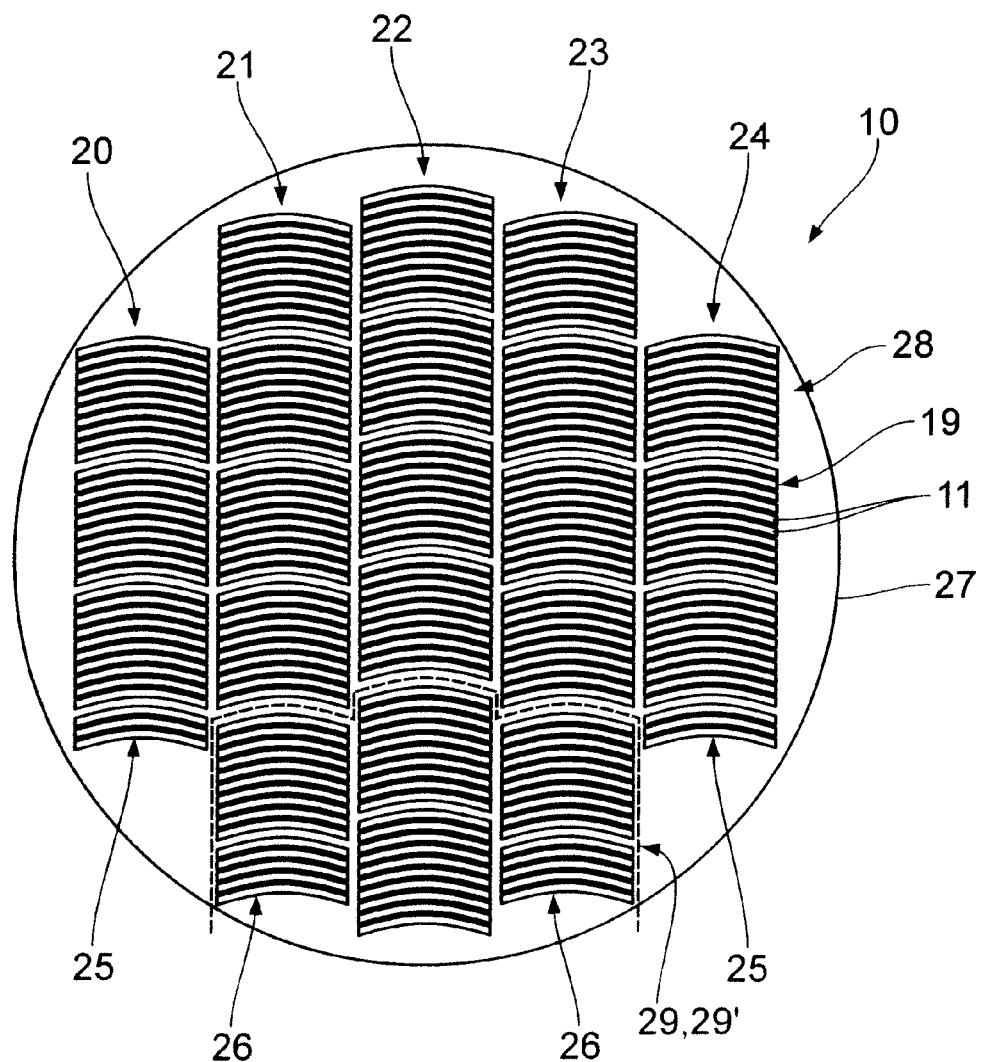
FIG. 2 is a plan view of an exemplified embodiment of a field facet mirror which is divided into a stationary subunit provided with groups of field facets and an interchangeable subunit provided with groups of field facets.

FIG. 2 shows a plan view of the field facet mirror 10. The individual field-facets 11 have the shape of an arc. It is also possible to provide straight, i.e. rectangular field facets. The field facets 11 are arranged in groups 19 of ten field facets 11 each. The groups 19 of field facets are again arranged in five columns of field facets which are numbered from the left to the right as 20, 21, 22, 23, and 24 in FIG. 2. The columns 20 and 24 comprise three groups of field facets of ten field facets 11 each and a residual group 25 of three field facets 11 each. The columns 21 and 23 comprise five groups 19 of field facets as well as a residual group 26 of five field facets 11. The central column 22 comprises six groups 19 of field facets. The columns of field facets 20 to 24 are arranged symmetrically in such a way as to fill a boundary circle 27, in which the columns 22 to 24 are inscribed, to the greatest possible extent. The groups of the field facet mirror 10 can also be arranged in a different way. The field facets can in particular be divided into a different number of columns. Moreover, it is possible to arrange less or more than ten field facets per group.

The field facet mirror 10 is divided into a stationary subunit 28 and an interchangeable subunit 29. A boundary between the subunits 28, 29 is shown dashed in FIG. 2. The interchangeable subunit 29 comprises the two bottom groups 19, 26 of the columns 21 and 23 as well as the two bottom groups 19 of the central column 22.

Figure 3:
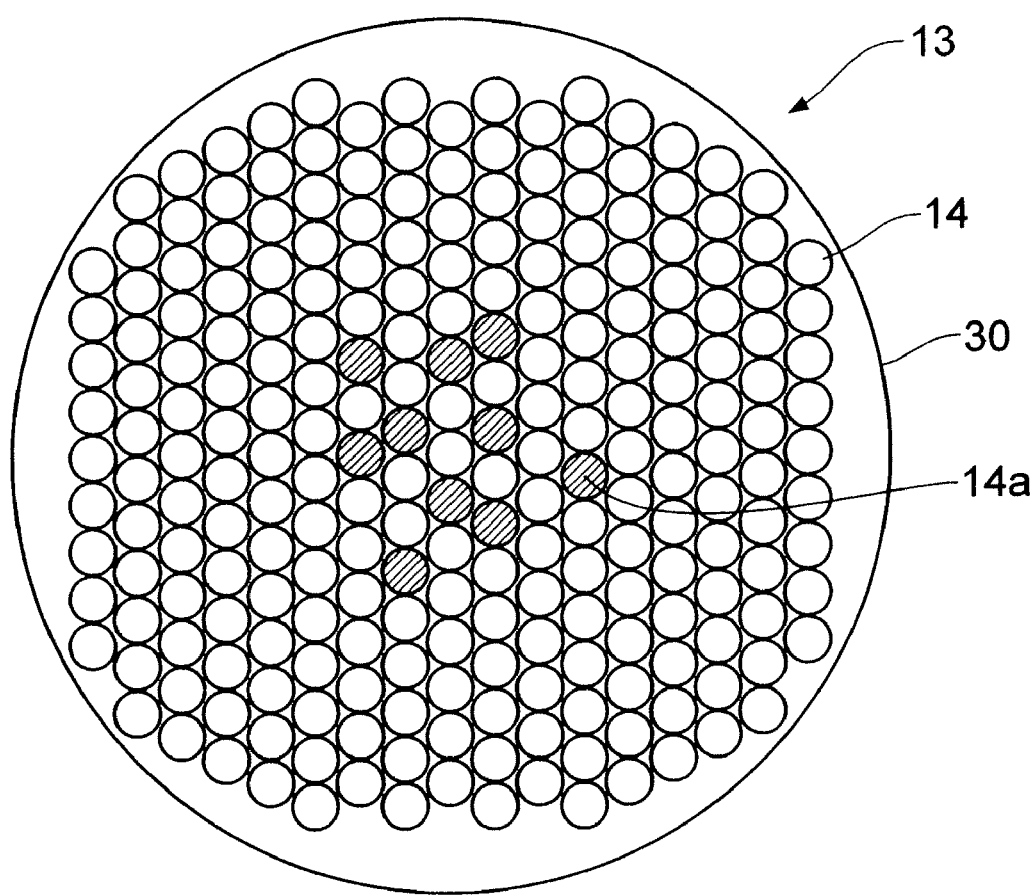
FIG. 3 is a schematic plan view of a pupil facet mirror where the pupil facets illuminated by a group of field facets of the interchangeable subunit of the field facet mirror according to FIG. 2 are shown hatched.
Figure 4:
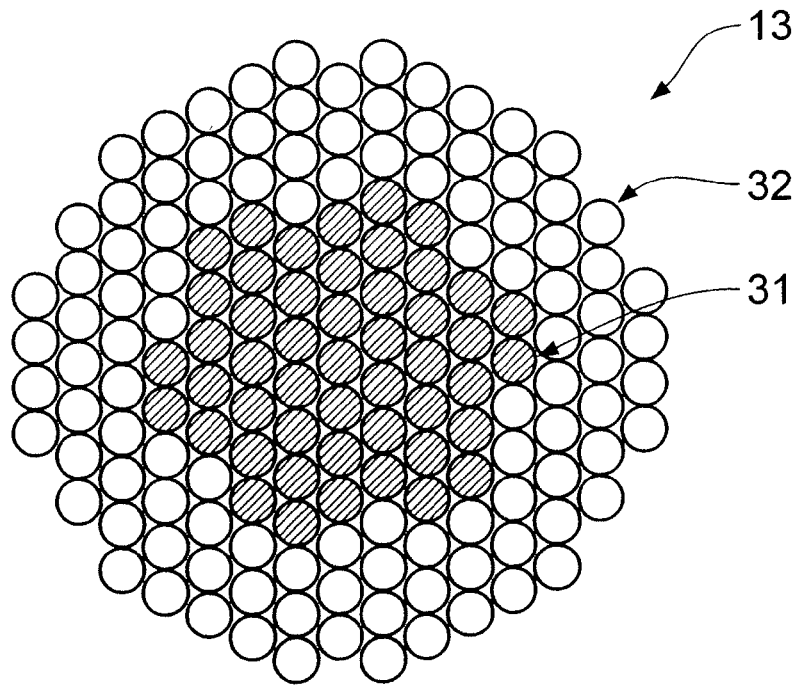
FIG. 4 is a schematic view of pupil facets of the pupil facet mirror which are illuminated by the stationary subunit and the interchangeable subunit of the field facet mirror according to FIG. 2.

FIG. 3 shows a schematic plan view of the pupil facet mirror 13. The pupil facets 14 are circular in shape and form hexagonal close packed units inscribed in a boundary circle 30. Other close packed configurations of the pupil facet mirror are also possible. The chosen configuration depends on the optical design and also on the shape of the individual pupil facets. Also, FIG. 3 indicates schematically the illumination of several groups of the pupil facets 14 via the field facets 11 of one of the groups 19 of field facets of the interchangeable subunit 29, e.g. the upper of the two groups 19 of field facets of the central column 22 of the interchangeable subunit 29 in FIG. 2. The ten field facets 11 of this group 19 illuminate ten pupil facets 14a which are arranged in a central area of the pupil facet mirror 13 and are shown diagonally hatched in FIG. 3. This central area is a tiny fracture of the entire aperture of the pupil facet mirror 13. In-between the field facets 14a thus illuminated, there are non-illuminated field facets 14 in this group 19 which are illuminated by other field facets of the interchangeable sub-unit 29. All in all, the field facets 11 of the interchangeable subunit 29 completely illuminate a central area 31 of the pupil facet mirror 13, as indicated in FIG. 4. The field facets 11 of the stationary subunit 28 of the field facet mirror 10 according to FIG. 2 illuminate a first annular area 32 surrounding the central area 31.

The boundary between the stationary subunit 28 and the interchangeable subunit 29 of the field facet mirror 10 is also indicated by dashed lines in FIG. 1. Here, the interchangeable subunit 29 is shown in a mirror position complementary to the stationary subunit 28, thus forming a complete field facet mirror 10. In the mirror position, the respective interchangeable sub-unit is situated in an exact position and an exact angle. A base body 33 of the interchangeable subunit 29 is attached to a free end of a lever arm 34, as shown in greater detail but still schematically in FIG. 8. The lever arm 34 is rotatable about a swivel joint 35 via a motor, thus allowing for a displacement of the interchangeable subunit 29 between the mirror position and a lower neutral position shown hatched in FIG. 8, thus ensuring a positioning displacement of the interchangeable subunit 29. A gear motor serves as a positioning drive 36. A pinion gear 37 driven by the gear motor engages with a rack 38 whose free end bears against the underside of the lever arm 34 at a distance to the swivel joint 35.

Figure 9:
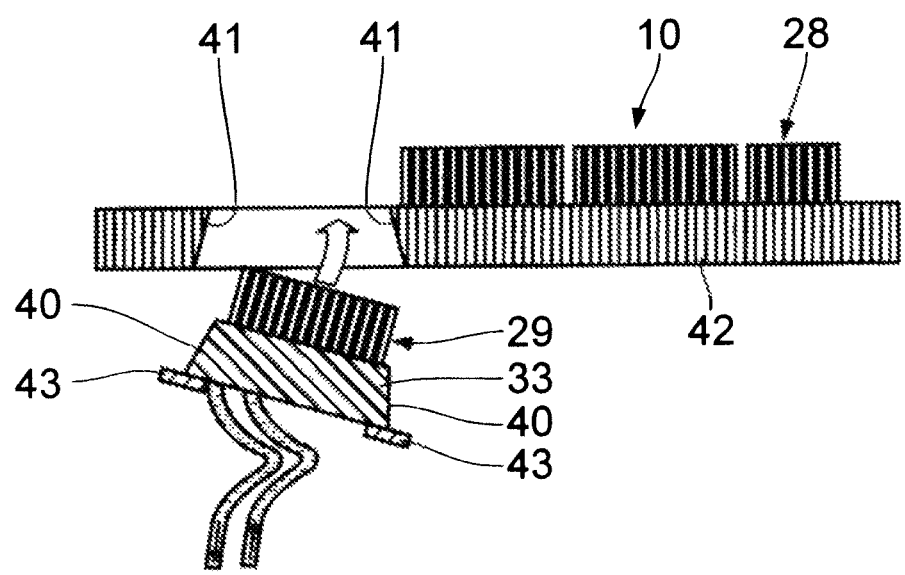
FIG. 9 is a schematic view of the base body of an interchangeable sub-unit before it is moved into the mirror position of the field facet mirror.

As shown schematically in FIG. 9, the base body 33 of the interchangeable subunit 29 is provided with oblique lateral guide surfaces 40 which are formed complementary to guide surfaces 41 of a base body 42 of the stationary subunit 28 of the field facet mirror 10. The mirror position of the interchangeable subunit 29 is moreover exactly determined by stops 43 bearing against the underside of the base body 42 from below when situated in the mirror position. Additionally, the mirror position is fixable via a snap-in locking unit which is not described here.

The positioning drive 36 is part of a changing device 44 for interchanging the interchangeable subunit 29 of the field facet mirror 10 with at least one further interchangeable subunit. The subunit which may serve as a replacement for the interchangeable subunit 29 is hereinafter referred to as 29'. The changing device 44 will be described in greater detail together with further embodiments of the field facet mirror. The changing device 44 is connected a central control device 46 of the projection exposure apparatus 1 via a signal which is sent along a signal line 45.

An interchanging drive 44a enables the changing device 44 to be rotated about a central swivel axis 44b which extends vertically downwards in FIG. 1. The interchangeable subunit 29 is thus interchangeable with the second interchangeable subunit 29', which is attached to another lever arm 34, once the interchangeable subunit 29 has been lowered to a neutral position. Since the swivel axis 44b is arranged eccentrically to the field facet mirror 10, the interchangeable subunits 29, 29' are oriented tangentially to the stationary part of the field facet mirror. The changing device 44 is therefore also referred to as a tangential changing device.

Figure 5:
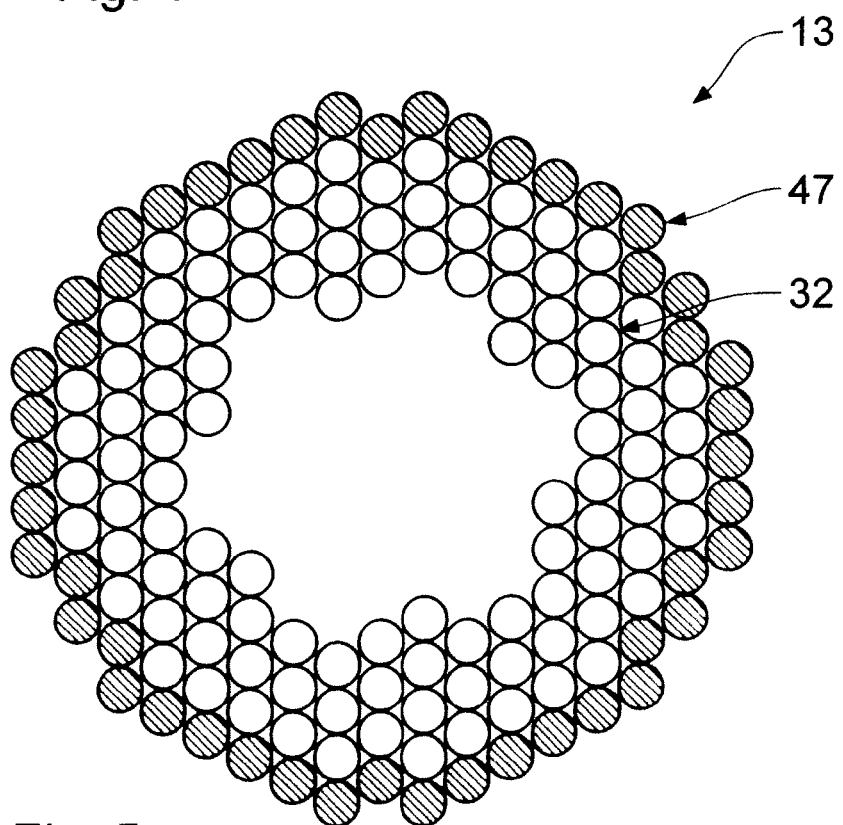
FIG. 5 is a schematic view of pupil facets of the pupil facet mirror according to FIG. 4, which are illuminated by the field facet mirror according to FIG. 2, after interchanging the interchangeable sub-unit with another interchangeable subunit.

The second interchangeable subunit 29', which replaces the interchangeable subunit 29 of the field facet mirror 10 according to FIG. 2, is not additionally shown in the drawing. According to FIG. 2, the second interchangeable subunit has the same structure and the same shape as the interchangeable subunit 29. The two interchangeable subunits are distinguished by the field facets 11 which are tilted to different extents. The field facets 11 of the second interchangeable subunit are tilted in a way as to not illuminate a central area of the pupil facet mirror 13 but an external annular area 47 surrounding the first annular area 32. Illumination of the pupil facet mirror 13 via the second interchangeable subunit 29', which replaces the interchangeable subunit 29, is shown in FIG. 5. The central area 31 is no longer illuminated. Instead, the two annular areas 32 and 47 are illuminated. A conventional illumination setting is thus interchangeable with an annular illumination setting by interchanging the interchangeable subunit 29 with the second interchangeable subunit 29'.

Figure 6:
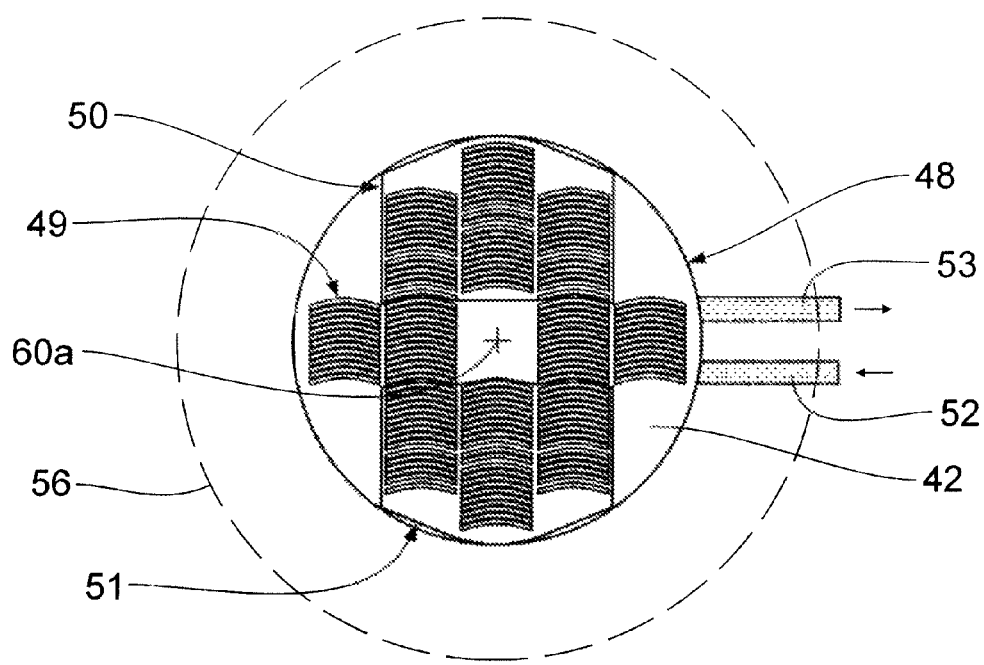
FIG. 6 is a schematic plan view of another field facet mirror provided with one stationary subunit and two interchangeable subunits.

FIG. 6 shows another example of a field facet mirror 48. Elements which correspond to those described previously with reference to FIGS. 1 to 5 as well as 8 and 9 are designated by the same reference numbers, and are not described again.

Along with a stationary subunit 49, the field facet mirror 48 is provided with two interchangeable subunits 50, 51. Both interchangeable subunits 50, 51 are shown in the mirror position in FIG. 6. The subunits 49 to 51 are cooled via a cooling liquid. The latter enters the base body 42 of the field facet mirror 48 through an inlet line 52 and leaves the base body 42 through a discharge line 53.

Figure 10:
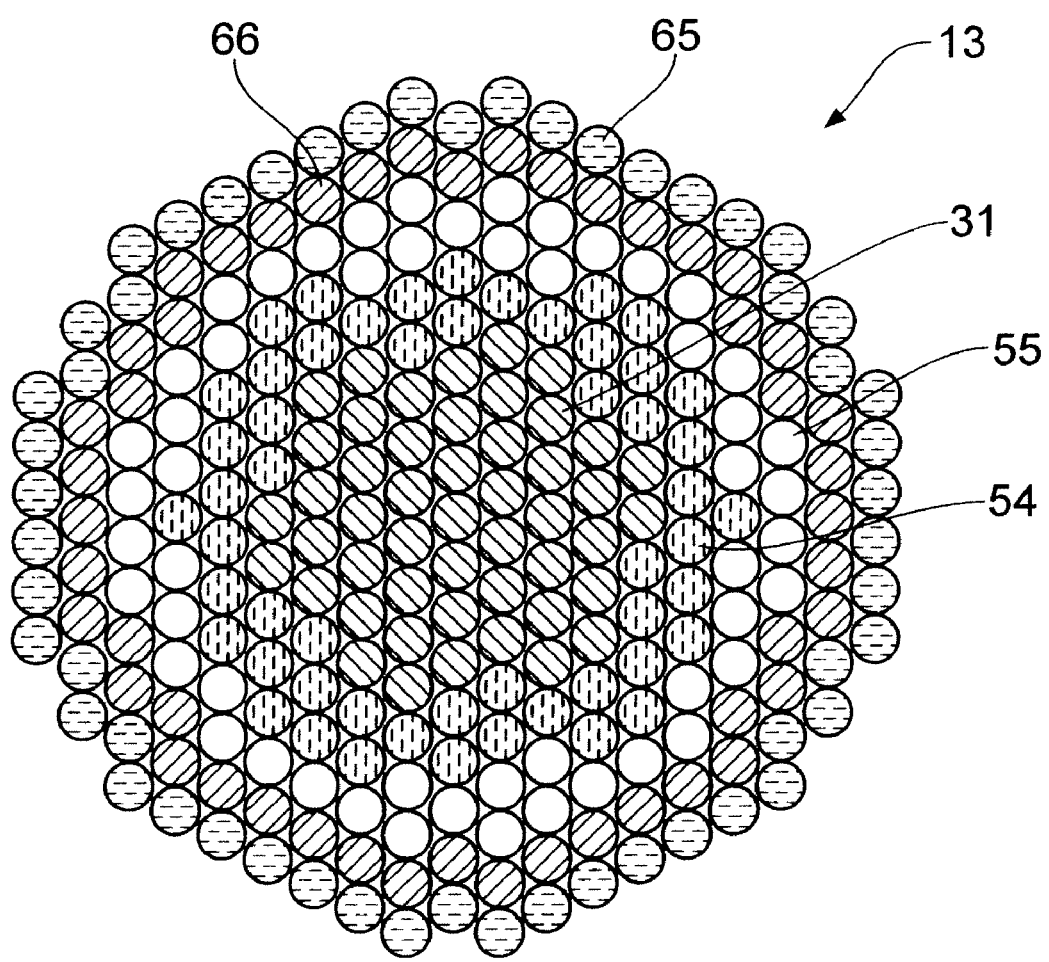
FIG. 10 shows a pupil facet mirror provided with differently marked areas which are illuminable via the subunits of the field facet mirror according to FIG. 6, and are provided with a plurality of pupil facets.

The interchangeable subunit 50 shown at the top of FIG. 6 illuminates the central area 31 of the pupil facet mirror 13, as shown in FIG. 10. The interchangeable subunit 51 shown at the bottom of FIG. 6 illuminates a first annular area 54 surrounding the central area 31. The stationary subunit 49 illuminates another annular area 55 surrounding the first annular area 54. The areas 31, 54 and 55 have a total of 155 pupil facets 14. The central area 31 and the annular area 66 have 49 pupil facets 14 each. The annular area 54 and the external annular area 65 have 54 pupil facets 14 each. The pupil facet mirror 13 is thus provided with a total of 257 pupil facets 14.

Figure 7:
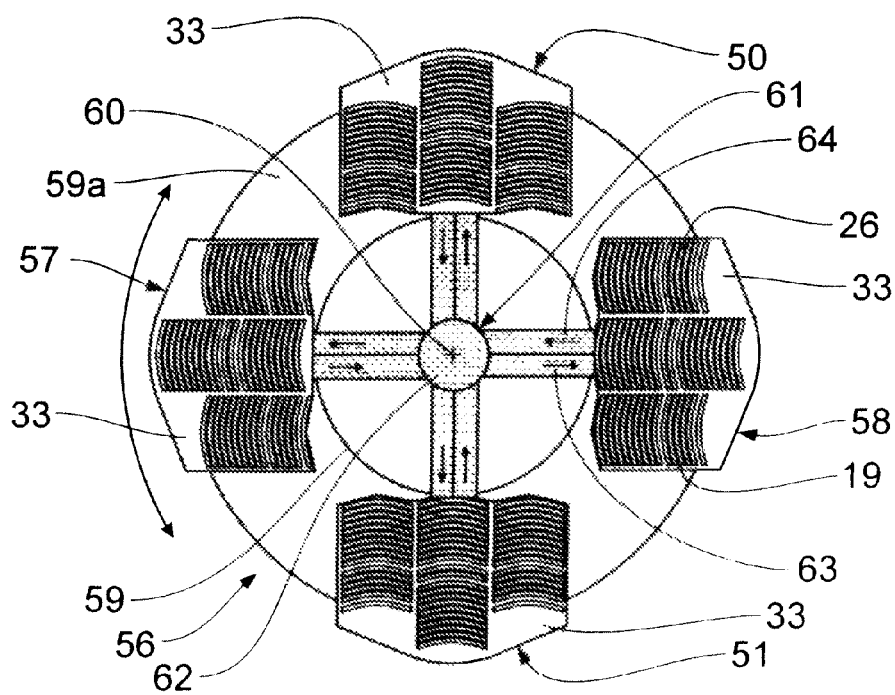
FIG. 7 is a plan view of a changing device for interchanging at least one of the two interchangeable subunits of the field facet mirror according to FIG. 6 with other interchangeable subunits, the changing device being provided with a total of four interchangeable subunits.
Figure 8:
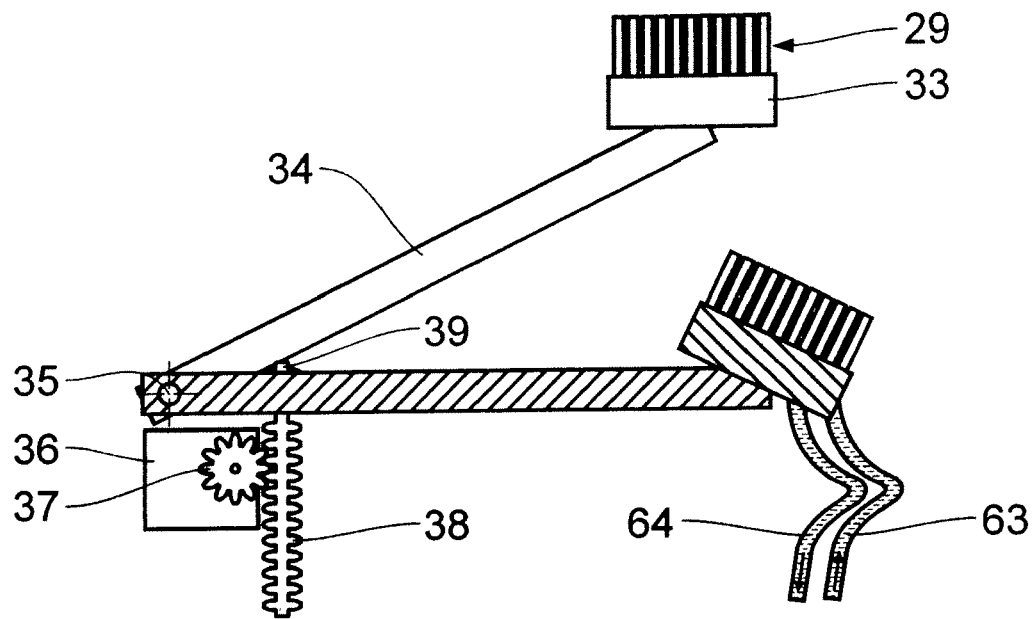
FIG. 8 is a schematic section of the changing device according to FIG. 7 which is provided with a positioning drive for positioning displacement of a base body of one of the interchangeable subunits between a mirror position and a neutral position.

A changing device 56 schematically shown in FIG. 7 is arranged at the side facing away from the EUV radiation 8, i.e. below the drawing plane and below the base body 42 in FIG. 6, by which the interchangeable subunits 50, 51 is interchanged with further interchangeable subunits 57, 58. The interchangeable subunits 50, 51, 57, 58 are shown in the lowered neutral position in FIG. 7. Details of the positioning drive, whose structure in the changing device 56 corresponds to that shown in FIG. 8 and FIG. 9, are omitted in FIG. 7.

An interchanging drive 59 schematically indicated in FIG. 7 enables the changing device 56 to be in particular infinitely rotated about a central swivel axis 60 by 90°, the swivel axis being perpendicular to the drawing plane in FIG. 7. The interchangeable subunits 50, 51, 57, 58 are disposed on an annular subunit carrier surrounding the interchanging drive 59. The swivel axis 60 coincides with a central axis 60a of the field facet mirror 48. Corresponding to the changing devices described hereinafter, the changing device 56 is thus also referred to as a circular changing device.

The changing device 56 is provided with a delivery line system 61 in order to cool the subunits 50, 51, 57, 58 via a cooling liquid. A line section 62 of the delivery line system 60 is arranged along the swivel axis 60. Inlet lines 63 and discharge lines 64 are connected to the line section 62, thus ensuring the transport of cooling liquid to and from the bodies 33 of the interchangeable subunits 50, 51, 57, 58. As indicated in FIG. 8 and FIG. 9, the lines 63, 64 are flexible, thus allowing a problem-free displacement of the subunits 29 or, alternatively, 50, 51, 57, 58.

When the interchangeable subunits 50, 51 are to be interchanged with the interchangeable subunits 57, 58, the interchangeable subunits 50, 51 are initially lowered from the mirror position to the neutral position via their positioning drives 36. The interchanging drive 59 is then rotated about the swivel axis 60 by 90° in the clockwise direction, i.e. away from the position shown in FIG. 7. Subsequently, the interchangeable subunits 57, 58 are lifted from the neutral position to the mirror position via their positioning drives 36 until the guide surfaces 40, 41 bear against each other, and the stops 43 bear against the underside of the base body 42 of the stationary subunit 49. The interchangeable subunits 57, 58 can additionally be locked via the snap-in locking unit (not shown) so as to fix the mirror position.

The interchangeable subunit 58 illuminates an external annular area 65 of the pupil facet mirror 13. The interchangeable subunit 57 illuminates an adjacent annular area 66 of the pupil facet mirror 13 adjoining the inside of the external annular area 65. When the interchangeable subunits 57, 58 are in use, the areas 31 and 54 of the pupil facet mirror 13 are not illuminated.

When the interchangeable subunits 50, 51 are interchanged with the second interchangeable subunits 57, 58, a conventional illumination setting is thus interchanged with an annular illumination setting.

Figure 11:
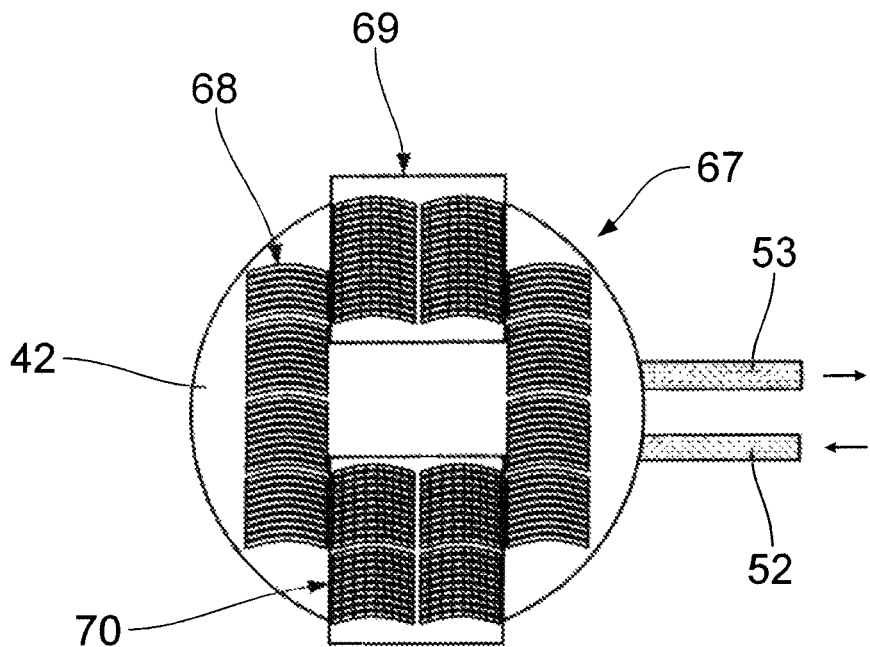
FIG. 11 shows, in a similar representation as in FIG. 6, another embodiment of a field facet mirror provided with one stationary subunit as well as two interchangeable subunits.

FIG. 11 shows a field facet mirror 67. Elements which correspond to those described previously with reference to FIGS. 1 to 10 are designated by the same reference numbers, and are not described again.

Figure 13:
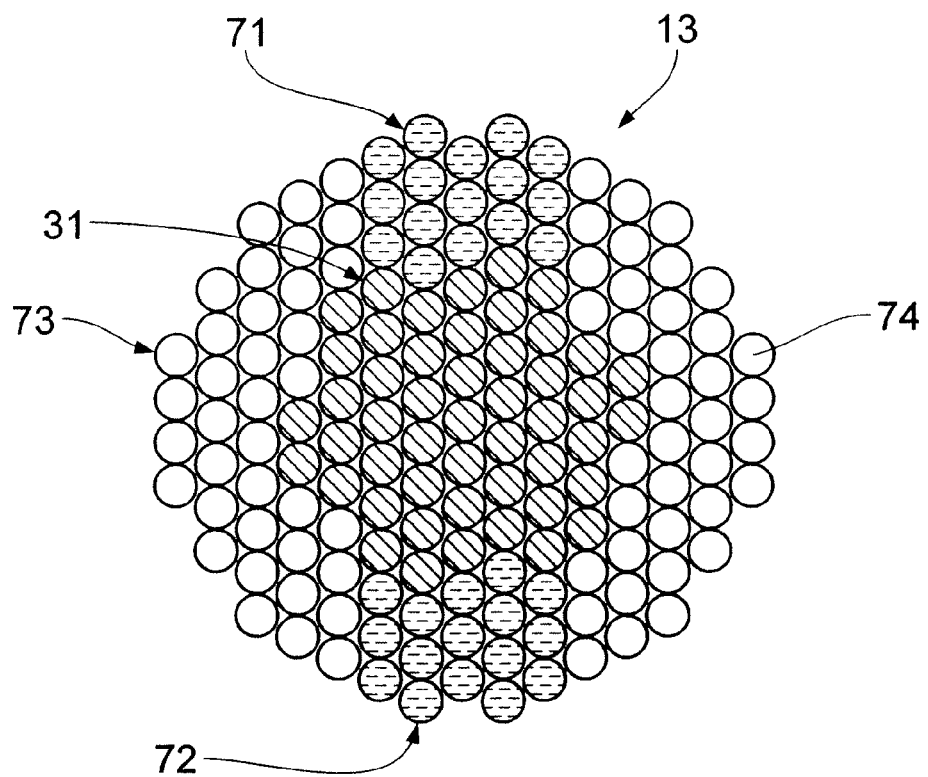
FIG. 13 shows the schematic illumination of a pupil facet mirror via the field facet mirror according to FIG. 11, the latter being represented in a first configuration comprising a stationary subunit and two interchangeable subunits.

The field facet mirror 67 is provided with a stationary subunit 68 and two interchangeable subunits 69, 70. Unlike the edge boundaries of the interchangeable subunits 29 or, alternatively, 50, 51, 57, 58, which have the shape of a segment, the boundaries of the interchangeable subunits 69, 70 are of rectangular shape. The interchangeable subunit 70 shown at the bottom of FIG. 11 illuminates the central area 31 of the pupil facet mirror 13. The interchangeable subunit 69 shown at the top of FIG. 11 illuminates two opposite areas 71, 72 adjoining the central area 31. The area 71 is disposed above the central area 31 in FIG. 13, while the area 71 is disposed below the central area 31 in FIG. 13.

Residual areas 73, 74 are illuminated by the stationary subunit 68 so as to obtain a conventional illumination by all areas 31, 71, 72, 73, 74. The conventional illumination, also referred to as a conventional setting, corresponds to a circular illumination with an intensity as uniform as possible within the circle. The residual areas 73, 74 form adjacent boundary areas having the shape of a segment and adjoining the central area 31.

Figure 12:
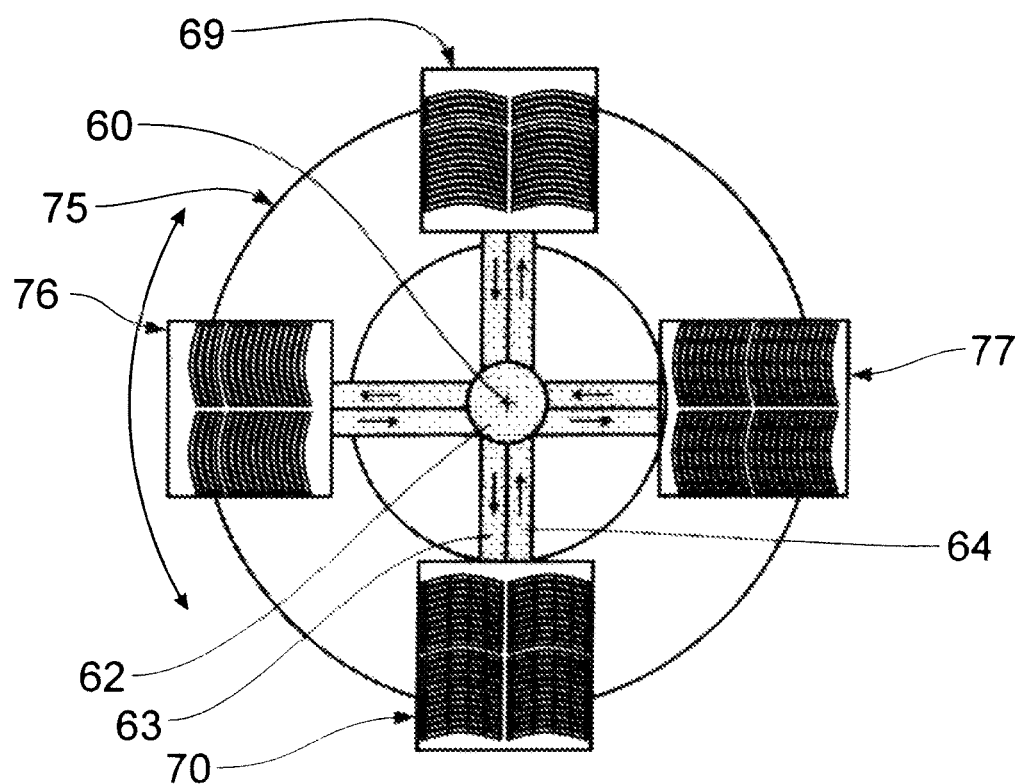
FIG. 12 shows, in a similar representation as in FIG. 7, a changing device which is provided with four interchangeable subunits for the field facet mirror according to FIG. 11.
Figure 14:
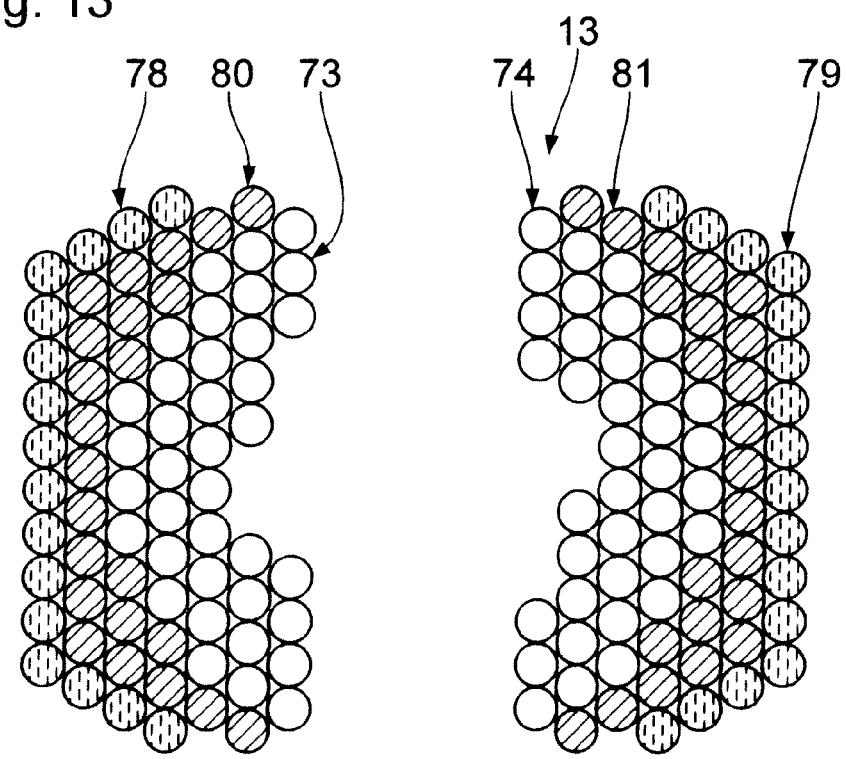
FIG. 14 shows the schematic illumination of a pupil facet mirror via the field facet mirror according to FIG. 11, the latter being represented in another configuration comprising a stationary subunit and two interchangeable subunits.

A changing device 75 for the field facet mirror, whose structure otherwise corresponds to that of the changing device 56, is provided with further interchangeable subunits 76, 77 in addition to the interchangeable subunits 69, 70. The interchangeable subunit 76 is shown on the left-hand side of FIG. 12, while the interchangeable subunit 77 is shown on the right-hand side of FIG. 12. Corresponding to the above descriptions with regard to the changing device 56, the changing device 75 is used to interchange the interchangeable subunits 69, 70 with the interchangeable subunits 76, 77. In order to do so, the changing device 75 is rotated about the central swivel axis 62 by 90° in the clockwise direction, i.e. away from the position shown in FIG. 12. When the interchangeable subunits are interchanged, the interchangeable subunit 76 thus takes the place of the interchangeable sub-unit 69, while the interchangeable subunit 77 takes the place of the interchangeable subunit 70. The interchangeable subunit illuminates two opposite external boundary areas 78, 79 of the pupil facet mirror which are shown on the left- and right-hand sides of FIG. 14 and have the shape of a pitch circle. The interchangeable subunit 77 illuminates two opposite adjacent boundary areas 80, 81 of the pupil facet mirror 13 shown on the left- and right-hand sides of FIG. 14, the adjacent boundary areas 80, 81 having the shape of a pitch circle and adjoining the outer boundary areas 78, 79. When the interchangeable subunits 76, 77 are in use, the areas 31 as well as 71, 72 of the pupil facet mirror 13 are not illuminated.

Thus, by inserting the interchangeable subunits 76, 77 into the pupil facet mirror 67, a dipole illumination is obtained which provides for two symmetrically illuminated areas (dipole setting).

Figure 15:
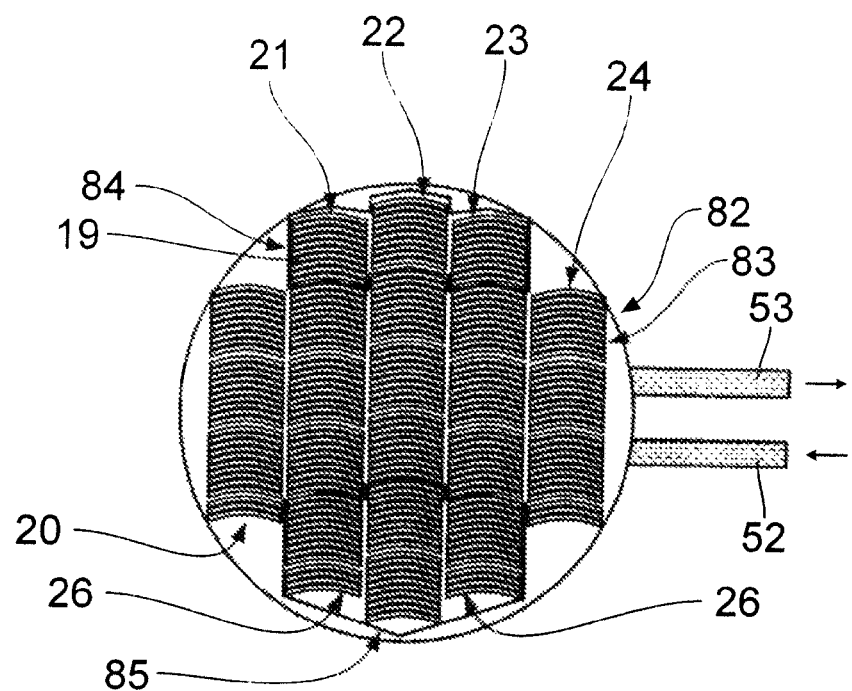
FIG. 15 shows another embodiment of a field facet mirror provided with one stationary subunit and two interchangeable subunits.
Figure 16:
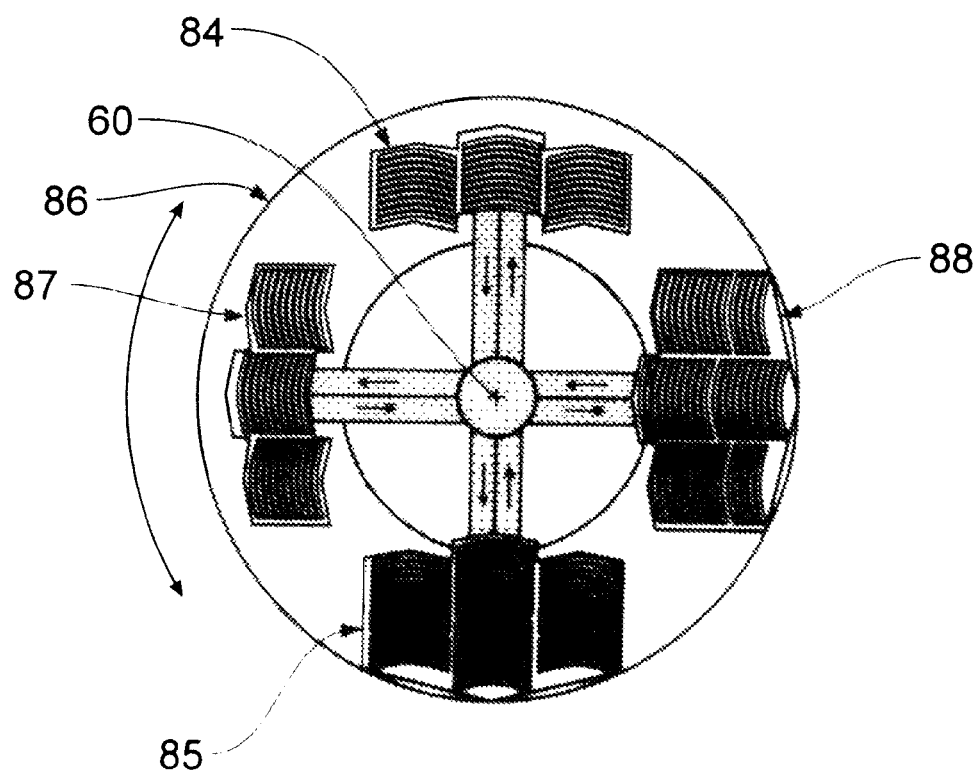
FIG. 16 shows, in a similar representation as in FIG. 7, a changing device for the interchangeable subunits of the field facet mirror according to FIG. 15, the changing device comprising four interchangeable subunits.

FIG. 15 shows a field facet mirror 82. Elements which correspond to those described previously with reference to FIGS. 1 to 14 are designated by the same reference numbers, and are not described again.

The arrangement of the field facets 11 in the field facet mirror 82 corresponds to the arrangement in the field facet mirror 10. The field facet mirror 82 is provided with a stationary subunit 83 and two interchangeable sub-units 84, 85. The interchangeable subunit 84 is shown at the top of FIG. 15, while the interchangeable subunit 85 is shown at the bottom of FIG. 15. The interchangeable subunits 84, 85 have different sizes and are thus provided with a different number of field facets 11. The interchangeable subunit 84 shown at the top of FIG. 15 has three groups 19 of field facets formed by the upper groups situated in the columns 21, 22, 23 of field facets.

The interchangeable subunit 85 shown at the bottom of FIG. 15 is configured as the lower boundary of the columns 21, 22, 23 of field facets. In the column 21 of field facets, the interchangeable subunit 85 possesses one group 19 of field facets and the residual group 26. In the column 22 of field facets, the interchangeable subunit 85 comprises two groups 19 of field facets. In the column 23 of field facets, the interchangeable subunit 85 possesses one group 19 of field facets and the residual group 26.

Corresponding to their different sizes and, therefore, different numbers of field facets 11, the interchangeable subunits 84, 85 thus also illuminate areas of different sizes of the pupil facet mirror 13. This proves useful in situations where the central area 31, for example, is provided with a larger number of pupil facets 14 than the adjacent annular area 54 (see FIG. 10).

A changing device 86 for the field facet mirror 82 is provided with further interchangeable subunits 87, 88 in addition to the interchangeable subunits 84, 85. Except for the configuration of the interchangeable subunits 84, 85, 87, 88, the structure of the changing device 86 corresponds to that of the changing device 56.

The external contour of the interchangeable subunit 87 corresponds to that of the interchangeable subunit 84. Moreover, the external contour of the interchangeable subunit 88 corresponds to that of the interchangeable sub-unit 85. As previously described in connection with the changing device 56, the interchangeable subunits 84, 85 are also interchangeable with the interchangeable subunits 87, 88 via the changing device 86, i.e. by rotating the changing device 86 about the swivel axis 60 by 90° in the clockwise direction. The interchangeable subunits 87, 88 illuminate other areas on the pupil facet mirror 13 than the interchangeable subunits 84, 85. This way, the changing device 86 also offers the possibility of changing between different illumination settings.

Some embodiments of a changing device can also be provided with a larger number of interchangeable subunits, thus allowing for a change between more than two interchangeable subunit configurations in a corresponding field facet mirror. Such a changing device (not shown) can be used to change, for example, between a conventional setting, an annular setting and a dipole setting. Depending on the configuration of the interchangeable subunits, the interchange of the interchangeable subunits also provides for other illumination settings, for example a quadrupole illumination setting, a conventional illumination setting with different maximum illumination angles (different sigma), or other, more exotic illumination settings. Dipole, quadrupole and annular illumination settings in a projection exposure apparatus, in particular in connection with EUV illumination radiation, provide for the imaging of finer structures than generally possible with conventional settings. The areas illuminated by the interchangeable subunits or the stationary subunit have the shape that is required in order to configure the individual illumination setting. In addition to the area shapes already described above, illumination of areas that have the shape of a sector, for example, or are provided with an entirely different contour at the boundaries is also possible.

It is also possible to provide more than two interchangeable subunits per field facet mirror.

As an alternative to a tangential changing device 44 as indicated in FIG. 1 or to a circular changing device 56, 75, 86, it is also possible to provide a linear changing device in which the individual interchangeable subunits are arranged on a carriage that is displaceable in a longitudinal direction, e.g. in the direction perpendicular to the drawing plane of FIG. 1.

The interchangeable subunits shown here are provided with several field facets 11 each which are combined in groups of field facets. In some embodiments, provision can be made for interchangeable subunits having only a single field facet 11.

Manufacturing of a microstructured or nanostructured element takes place by positioning the structure to be imaged, i.e. the pattern to be imaged, of the reticle 2 into the object field of the reticle or object plane. The wafer 4 is positioned in the image field of the image plane or wafer plane 5. While the projection exposure apparatus 1 is in use, the pattern on the reticle 2 is projected onto an illumination light-sensitive layer of the wafer 4. This layer can then be developed so as to manufacture the microstructured or nanostructured element.

The facet mirror, which is provided with the interchangeable subunits and also referred to as the field facet mirror in the embodiments described above, is implemented in a first configuration of subunits. As soon as another illumination setting is required, a subunit of the facet mirror is interchanged with an interchangeable subunit, thus modifying the configuration of subunits of the facet mirror. Subsequently, another projection cycle is carried out, the subunits of the facet mirror being arranged in a second configuration.

When changing between two illumination settings, it is possible to interchange exactly one subunit of the field facet mirror. However, it is also possible to interchange at least two subunits in order to change the illumination setting.

Other embodiments are in the claims.

What is claimed is:

1. Illumination optics configured to illuminate an illumination field in a reticle plane with radiation, the illumination optics comprising:
   a facet mirror including a plurality of facets configured to generate a defined illumination setting in the illumination field, each facet being configured to be allocated to a partial beam of the radiation, the facet mirror comprising a plurality of subunits which themselves are comprised of facet groups having at least one facet each, the plurality of subunits of the facet mirror comprising a first subunit; and
   a changing device configured to remove the first subunit of the facet mirror from the illumination optics and replace the first subunit with a second subunit of facet groups, the second subunit being different from the first subunit,
   wherein the illumination optics are configured to be used in EUV microlithography.

2. The illumination optics according to claim 1, wherein the facet mirror is configured as a field facet mirror having a plurality of field facets configured to generate secondary light sources, a pupil facet mirror is in the vicinity of at least some of the secondary light sources generated by the field facet mirror, the pupil facet mirror has a plurality of pupil facets which during use are impinged by EUV radiation via their corresponding field facets, and the pupil facet mirror is part of optical equipment configured to image the field facet mirror in the reticle plane.

3. The illumination optics according to claim 2, wherein the field facets of the field facet mirror are configured to enable a subunit of the field facet mirror to illuminate pupil facets which are arranged in a sufficiently small area of the pupil facet mirror when compared with the entire aperture of the pupil facet mirror so that the illumination setting is changeable between a conventional setting and an annular setting by removing and replacing subunits of the field facet mirror.

4. The illumination optics according to claim 2, wherein the second subunit illuminates a central area of the pupil facet mirror.

5. An illumination optics according to of claim 2, wherein during use the second subunit illuminates a first annular area surrounding a central area of the pupil facet mirror.

6. The illumination optics according to claim 2, wherein during use the second e subunit illuminates an external annular area of the pupil facet mirror.

7. The illumination optics according to claim 2, wherein during use the second subunit illuminates an adjacent annular area of the pupil facet mirror, and the adjacent annular area adjoins an external annular area.

8. The illumination optics according to claim 2, wherein during use the second subunit illuminates two opposite external boundary areas of the pupil facet mirror, and the boundary areas have the shape of a pitch circle or a segment.

9. The illumination optics according to claim 2, wherein during use the second subunit illuminates two opposite adjacent boundary areas of the pupil facet mirror, and the adjacent boundary areas have the shape of a pitch circle or a segment and adjoining the external boundary areas of the pupil facet mirror.

10. The illumination optics according to claim 2, wherein during use the second subunit illuminates opposite areas adjoining the central area.

11. The illumination optics according to claim 1, wherein the changing device comprises:
    an interchanging drive configured to displace a subunit carrier to change between two subunits of the field facet mirror; and
    a positioning drive configured to position a base body of one of the subunits of the changing device between a mirror position, where the subunit is situated in a fixed position in the field facet mirror, and a neutral position for displacing the subunit carrier.

12. The illumination optics according to claim 11, wherein the interchanging drive includes a swivel drive configured to enable the subunit carrier to be rotated about a swivel axis.

13. The illumination optics according to claim 12, wherein the swivel axis coincides with a central axis of the field facet mirror.

14. The illumination optics according to claim 12, wherein the changing device includes a delivery line system for a cooling medium to cool subunits disposed on the subunit carrier, and a line section of the delivery line system extends along the swivel axis.

15. The illumination optics according to claim 14, wherein at least one line section of the delivery line system is configured as a flexible line section.

16. The illumination optics according to claim 11, wherein the positioning drive includes a lever arm having a free end attached to a base body and rotatable about a swivel joint via a motor.

17. The illumination optics according to claim 11, further comprising at least one stop configured to define the mirror position.

18. The illumination optics according to claim 11, further comprising at least one snap-in locking unit for fixing the mirror position.

19. The illumination optics according to claim 1, wherein at least one of area selected from the group consisting of the pupil facet mirror and the illumination field is illuminated by stationary subunits of the facet mirror.

20. A system, comprising:
    an illumination optics according to claim 1; and
    an EUV light source, wherein the system is configured as an illumination system.

21. An apparatus, comprising:
an illumination system comprising an illumination optics according to claim 1, the illumination system having an illumination field; and
projection optics configured to image the illumination field of the illumination system to an image field in an image plane,
wherein the apparatus is a projection exposure apparatus.

22. A method, comprising using a projection exposure apparatus to make a microstructured element,
wherein the projection exposure apparatus comprises:
an illumination system comprising an illumination optics according to claim 1, the illumination system having an illumination field; and
projection optics configured to image the illumination field of the illumination system to an image field in an image plane.

23. The method of claim 22, wherein the method comprises:
providing a substrate to at least part of which a layer of a light-sensitive material is applied;
providing a mask or a reticle with structures to be imaged; and
exposing at least a part of the reticle to an area of the light-sensitive layer via the projection exposure apparatus.

24. The method according to claim 22, comprising:
implementing the facet mirror of the illumination optics of the projection exposure apparatus in a first configuration of subunits;
removing the first subunit of the facet mirror and replacing the first subunit of the facet mirror with the second subunit so as to create a second configuration of subunits of the facet mirror; and
projecting at least a part of the reticle to an area of the light-sensitive layer via the projection exposure apparatus.

25. The method according to claim 24, wherein the method comprises removing multiple subunits of the facet mirror and replacing the multiple subunits of the facet mirror with other subunits of facet groups.

* * * * *

UNITED STATES PATENT AND TRADEMARK OFFICE
CERTIFICATE OF CORRECTION

| | | |
|---|---|---|
| PATENT NO. | : 7,858,957 B2 | Page 1 of 1 |
| APPLICATION NO. | : 11/945401 | |
| DATED | : December 28, 2010 | |
| INVENTOR(S) | : Berndt Warm et al. | |

It is certified that error appears in the above-identified patent and that said Letters Patent is hereby corrected as shown below:

Column 12, line 4, Claim 5, after "to" delete "of".

Column 12, line 8, Claim 6, after "second" delete "e".

Signed and Sealed this
Twenty-second Day of March, 2011

David J. Kappos
*Director of the United States Patent and Trademark Office*